United States Patent [19]
Schuele

[11] Patent Number: 5,760,474
[45] Date of Patent: Jun. 2, 1998

[54] CAPACITOR, INTEGRATED CIRCUITRY, DIFFUSION BARRIERS, AND METHOD FOR FORMING AN ELECTRICALLY CONDUCTIVE DIFFUSION BARRIER

[75] Inventor: Paul J. Schuele, Boise, Id.

[73] Assignee: Micron Technology, Inc., Boise, Id.

[21] Appl. No.: 675,997

[22] Filed: Jul. 9, 1996

[51] Int. Cl.⁶ ............................ H01L 23/48; H01L 27/108
[52] U.S. Cl. .......................... 257/754; 257/296; 257/306; 257/751; 257/765; 257/771; 438/396
[58] Field of Search ............................... 257/296, 306, 257/751, 765, 771, 754; 438/396

[56] References Cited

U.S. PATENT DOCUMENTS

| | | | |
|---|---|---|---|
| 4,842,710 | 6/1989 | Freller et al. | 204/192.38 |
| 5,096,749 | 3/1992 | Harada et al. | 427/404 |
| 5,231,306 | 7/1993 | Meikle et al. | 257/751 |
| 5,318,840 | 6/1994 | Ikeda et al. | 428/336 |
| 5,554,866 | 9/1996 | Nishioka et al. | 257/395 |
| 5,656,383 | 8/1997 | Tanaka et al. | 428/627 |

*Primary Examiner*—Valencia Wallace
*Attorney, Agent, or Firm*—Wells, St. John, Roberts, Gregory & Matkin, P.S.

[57] ABSTRACT

A capacitor having a pair of conductive electrodes separated by a dielectric layer and wherein at least one of the electrodes comprise $Ti_xAl_{1-x}N$, and wherein the variable "x" lies in a range of about 0.4 to about 0.8. The invention also contemplates a method for forming an electrically conductive diffusion barrier on a silicon substrate and which comprises providing a chemical vapor deposition reactor having a chamber; positioning the silicon substrate in the chemical vapor deposition reactor chamber; providing a source of gaseous titanium aluminum and nitrogen to the chemical vapor deposition reactor chamber; and providing temperature and pressure conditions in the chemical vapor deposition reactor chamber effective to deposit an electrically conductive diffusion barrier layer on the silicon substrate comprising $Ti_xAl_{1-x}N$, and wherein the variable "x" is in a range of about 0.4 to about 0.8.

4 Claims, 4 Drawing Sheets

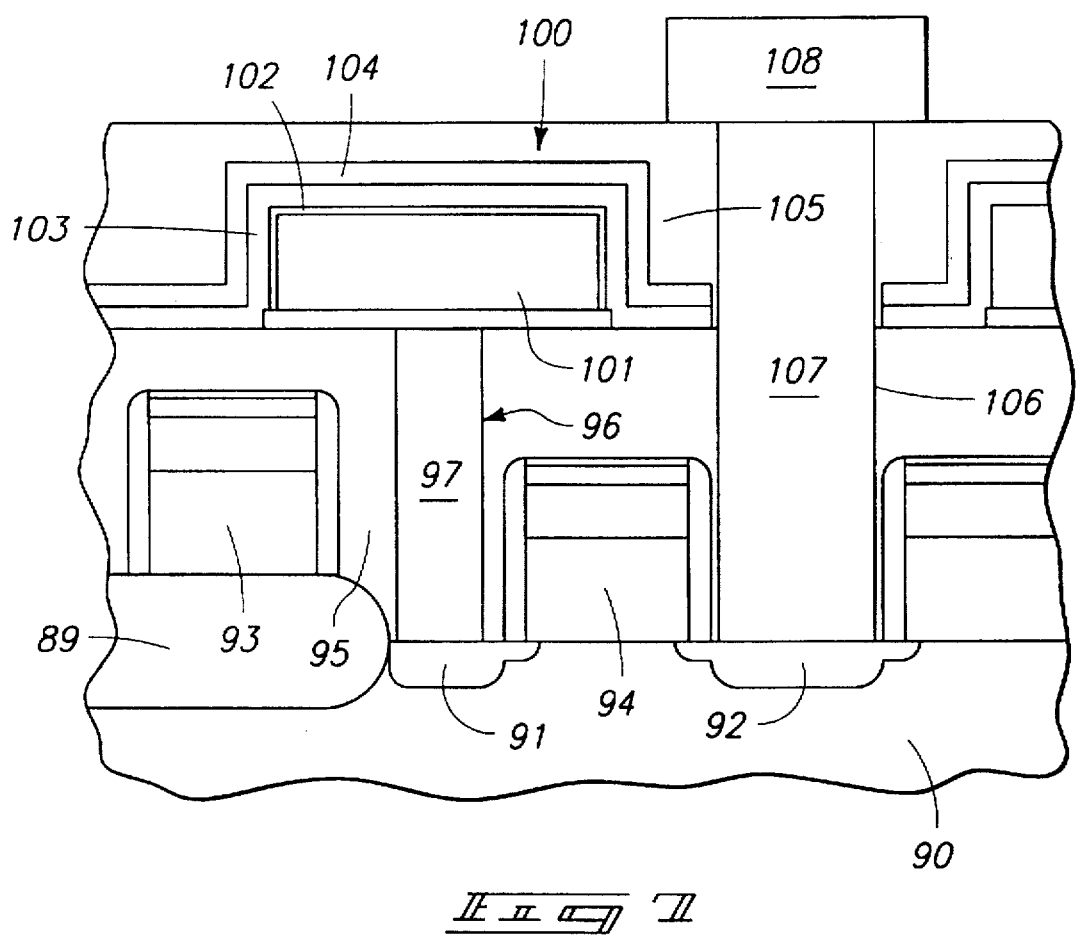

5,760,474

1

CAPACITOR, INTEGRATED CIRCUITRY, DIFFUSION BARRIERS, AND METHOD FOR FORMING AN ELECTRICALLY CONDUCTIVE DIFFUSION BARRIER

PATENT RIGHTS STATEMENT

This invention was made with Government support under Contract No. MDA972-93-C-0033 awarded by Advanced Research Projects Agency (ARPA). The Government has certain rights in this invention.

TECHNICAL FIELD

This invention relates to capacitor constructions, integrated circuitry, diffusion barriers and methods for forming diffusion barriers.

BACKGROUND OF THE INVENTION

In the processing of integrated circuits electrical contact must be made to active device regions formed within the wafer substrate typically comprising monocrystalline silicon. The active device regions are connected by highly conductive paths or lines which are fabricated above an insulator material, and which covers the substrate surface. To provide electrical connection between the conductive path and active device regions, an opening or contact is provided. Ultimately, an electrically conductive contact filling material is provided in the contact opening to make electrical contact to the underlying active device region.

It is desirable, during the processing of integrated circuits, to provide an intervening layer to prevent the intermixing of the contact filling materials with silicide and the underlying silicon. Accordingly, this intervening layer is typically provided to prevent the diffusion of the silicon and silicide with an associated plug filling metal and to effectively adhere a plug filling metal to the underlying substrate. Such material is accordingly also electrically conductive and commonly referred to as a "barrier layer" due to the anti-diffusion properties of same. U.S. Pat. No. 5,231,306, and pending application Ser. Nos. 08/631,235, filed on Apr. 11, 1996, and 08/643,420, filed on May 8, 1996, all assigned to the assignee of the present invention, are directed to the use and fabrication of such barrier layers. The teachings of the aforementioned patent, and pending applications are incorporated by reference herein.

In the formation of a stacked capacitor structure which is employed in a DRAM, a lower electrode is typically electrically connected to another substrate device by means of a polysilicon plug. Normally, a barrier layer separates the polysilicon plug from the lower electrode of the capacitor to prevent both silicon diffusion into the electrode and oxidation of the plug which may be occasioned by the continued processing of the integrated circuit. A DRAM storage node capacitor is formed when a dielectric, or ferroelectric layer is interposed between a lower electrode and an upper electrode. The capacitor is typically covered and protected by a planarized layer of silicon dioxide. The capacitor is accessed by connecting a bit line to the capacitor lower electrode through a word line transistor.

The above design is not without drawbacks. For example, to obtain useful electrical performance, the dielectric or ferroelectric layer is typically deposited or otherwise annealed at high temperature and in an oxygen ambient. Under these processing conditions, oxidation of the underlying barrier layer, polysilicon plug or active area may undesirably occur. If oxide forms, a parasitic capacitor will be created. This parasitic capacitor would be disposed in series with the storage node capacitor. The resulting parasitic capacitor will prevent the full application of voltage to the storage node. This, in turn, will result in a decrease in the amount of charge which can be stored by the capacitor.

To address this problem, semiconductor processors have typically utilized a layer of a noble metal or conductive oxide as the lower electrode of the storage node capacitor so that the electrode is conductive following dielectric deposition. In this physical arrangement, the electrode and barrier layer, in combination, protect the polysilicon plug from oxidation. Further, the underlying transistor is protected from oxygen by silicon dioxide and the polysilicon plug. Still further, the barrier layer also prevents silicon diffusion from the polysilicon plug to the lower electrode. It has been discovered that if silicon diffuses through the lower electrode to the dielectric layer, this diffusing silicon can subsequently oxidize thereby forming a parasitic silicon dioxide capacitor, or in the alternative, the silicon reacts with the dielectric and decreases the dielectric constant of the layer. This condition may also increase the leakage current.

It would be desirable, therefore, to improve upon the design of a capacitor electrode in a method for forming a capacitor electrode which achieves the benefits to be derived from prior fabrication techniques, but avoids the detriments individually associated therewith.

BRIEF DESCRIPTION OF THE DRAWINGS

Preferred embodiments of the invention are described below with reference to the following accompanying drawings.

FIG. 7 is a view of the FIG. 2 wafer, in one embodiment, at a processing step subsequent to that shown in FIG. 2.

SUMMARY OF THE INVENTION

The present invention relates to a capacitor construction in which a discreet layer of the capacitor comprises $Ti_xAl_{1-x}N$, and where "x" lies in a range of about 0.4 to about 0.8.

The present invention also relates to a method of fabricating a capacitor having this same discrete layer.

DETAILED DESCRIPTION OF THE SPECIFIC EMBODIMENTS

This disclosure of the invention is submitted in furtherance of the constitutional purposes of the U.S. Patent Laws "to promote the progress of science and useful arts" (Article 1, Section 8).

Figure 1:
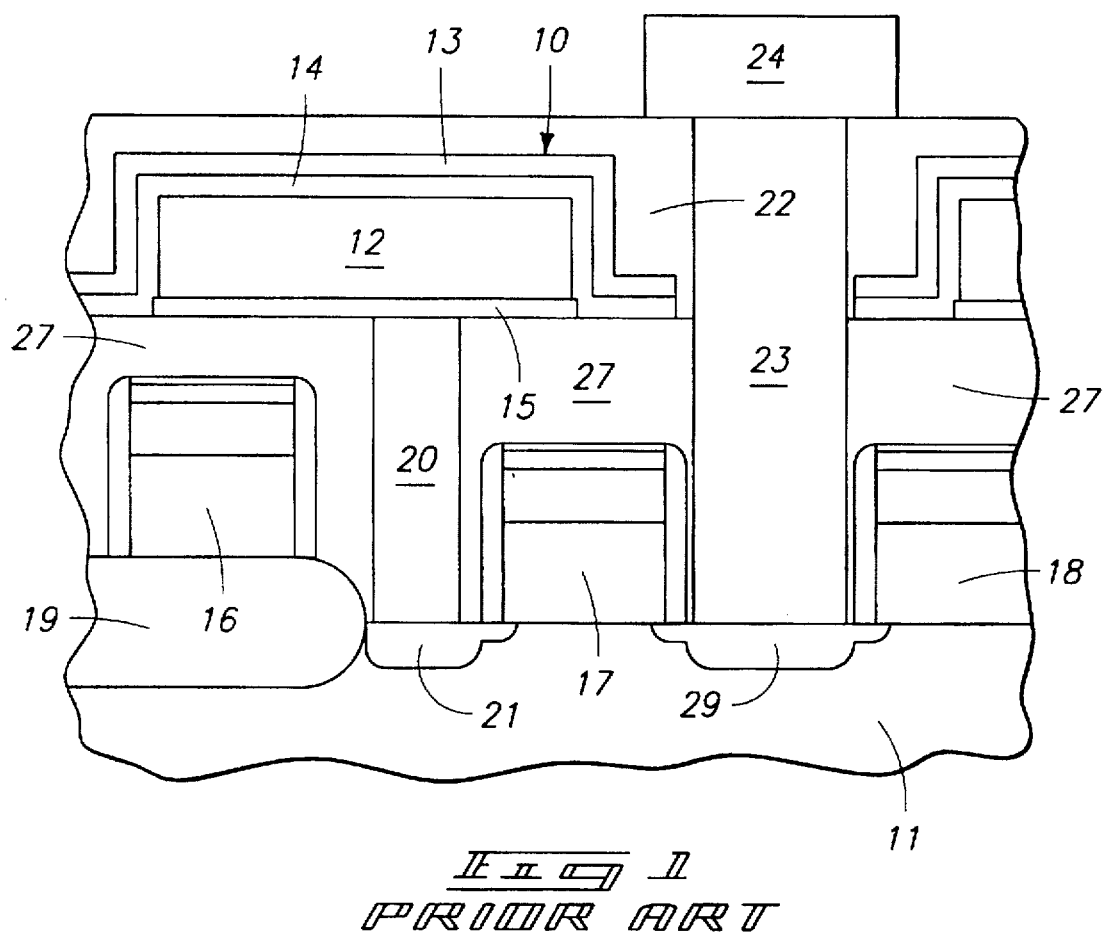
FIG. 1 is a diagrammatic, sectional view of a prior art semiconductor wafer.

To best understand the present invention, a prior art capacitor 10 is described with reference to FIG. 1. The capacitor 10 is formed relative to a silicon substrate 11 in association with DRAM integrated circuitry. A field oxide region 19, and a series of word lines 16, 17, and 18 are provided relative to substrate 11. The capacitor 10 has a lower electrode 12; an upper electrode 13, which is spaced therefrom; and a dielectric or ferroelectric layer 14 which is positioned intermediate the upper and lower electrodes 12 and 13, respectively. A barrier layer 15 is positioned between the lower electrode 12, and the silicon substrate 11. A planarized silicon dioxide layer 27 is provided outwardly of the substrate 11 and the word lines 16, 17 and 18. A polysilicon plug 20 ohmically connects with conductive barrier layer 15. The barrier layer 15 is provided to prevent the diffusion of silicon from plug 20 into the capacitor 10. One material of choice for use as a diffusion barrier layer 15 is titanium nitride. Titanium nitride is an attractive material as a contact diffusion barrier in integrated circuits because it behaves as a substantially impermeable barrier to the diffusion of silicon and because the activation energy for the diffusion of other impurities is very high. Titanium nitride is also chemically and thermodynamically very stable and exhibits typically low electrical resistivities of the transition metal carbides, borides or nitrides.

Titanium nitride can be provided or formed on the substrate 11 in one of the following manners: a) by evaporating titanium in a nitrogen ambient; b) reactively sputtering titanium in an argon and nitrogen mixture; c) sputtering from a titanium nitride target in an inert argon ambient; d) sputter-depositing titanium in an argon ambient and converting it to titanium nitride in a separate plasma nitridation step; or e) by low pressure chemical vapor deposition.

The polysilicon plug 20 is electrically connected with an underlying diffusion region 21 formed in the silicon substrate 11 and which is associated with the word line 17. A layer of planarized silicon dioxide 22 is formed over the capacitor 10. An electrically conductive contact plug 23 is formed through the silicon dioxide layers 22 and 27 to an opposing substrate diffusion region 29 associated with the word line 17. A bit line 24 is formed outwardly of the oxide layer 22, with the conductive plug 23 electrically connecting bit line 24 with the diffusion region 29.

The method for fabricating the capacitor 10 has heretofore included the deposit of the dielectric layer 14 at a high temperature, and in an oxygen ambient. Under these processing conditions, if oxidation of the barrier layer 15, polysilicon plug 20 or underlying diffusion region 21 occurs, a parasitic capacitor will be formed in series with the capacitor 10. As noted earlier, this condition will impede the realization of full voltage to the capacitor 10 thus causing a decrease in the amount of charge which can be stored. For this and other reasons, a material has been chosen for the lower electrode 12 which is conductive after dielectric deposition. The material utilized heretofore has typically been a noble metal or a conductive oxide. As was discussed earlier, this material substantially protects the polysilicon plug 20 from oxidation; and the transistor is further protected from the effects of oxygen by the silicon dioxide layer 27. The barrier layer 15 also prevents silicon diffusion from the polysilicon plug to the lower electrode 12. If silicon diffuses through the lower electrode to the dielectric layer 14, the silicon can subsequently oxidize thereby forming a parasitic capacitor or in the alternative can react with the dielectric layer 14 thereby decreasing the dielectric constant of the layer or increase the leakage current, both of which are undesirable.

Figure 2:
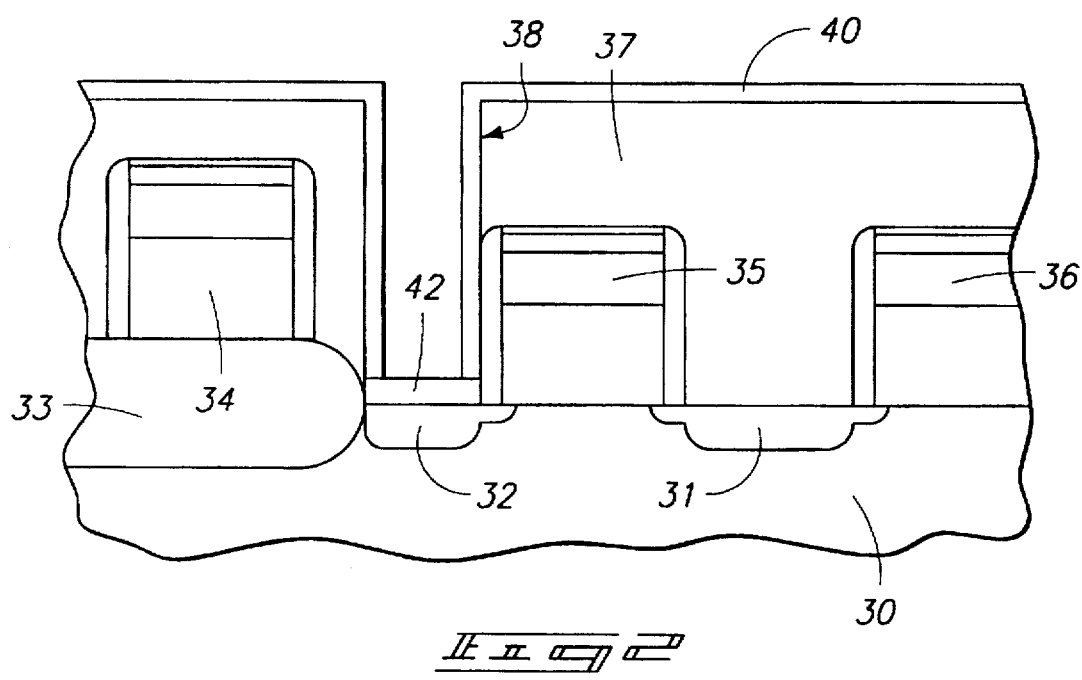
FIG. 2 is a diagrammatic sectional view of a semiconductor wafer at one processing step in accordance with the present invention.

The current invention is shown in FIGS. 2 through 6. As illustrated in FIG. 2, a silicon substrate 30 has diffusion regions or nodes 31 and 32 formed therein. A field oxide region 33, and a series of word lines 34, 35 and 36 are formed outwardly relative to the substrate 30. A layer of silicon dioxide 37 is formed outwardly of the silicon substrate 30, and in covering relation relative to the word lines 34, 35 and 36. Electrical connection to the underlying node 32 is formed by opening a contact 38 to the underlying node 32. Thereafter, a layer of titanium 40 is applied outwardly of the silicon dioxide. Following the deposit of the layer of titanium, this layer is annealed in a nitrogen ambient to form a titanium suicide layer 42 in ohmic electrical contact with the underlying node 32 The unreacted titanium is removed following the formation of the titanium silicide layer by using a wet etch chemistry which leaves the titanium silicide layer in ohmic electrical contact with the underlying node 32. The wet etch chemistry may include the use of $H_2SO_4$ and $H_2O_2$ or $NH_4OH$ and $H_2O_2$ for example.

Figure 3:
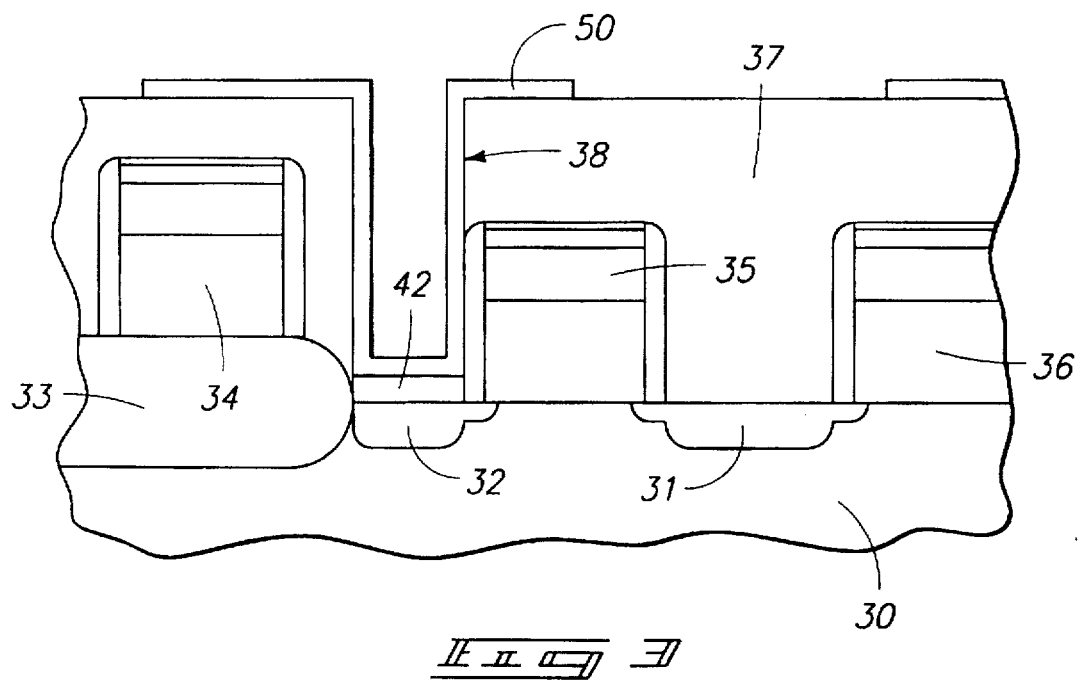
FIG. 3 is a view of the FIG. 2 wafer at a processing step subsequent to that shown by FIG. 2.

Referring to FIG. 3, a layer of $Ti_xAl_{1-x}N$ 50 is deposited, as shown, using a chemical vapor deposition method to a given depth. More specifically, the thickness of $Ti_xAl_{1-x}N$ is preferably in a range of approximately 300 to approximately 1500 Angstroms. The preferred thickness is approximately 500 Angstroms. The preferred chemical vapor deposition method comprises supplying titanium in the form of gaseous TMAT $(Ti[N(CH_3)_2]_4)$ and aluminum in the form of dimethylaminealane (DMEAA). These precursor gases are supplied to the substrate 30 which ha s been heated to a temperature ideally in the range of approximately 250 to about 550 degrees C. The sources of gaseous titanium and aluminum are introduced to the chemical vapor deposition reactor by means of a carrier gas through an accompanying shower head into a chemical vapor deposition reactor chamber (not shown). A source of nitrogen, for example, in the form of ammonia, can be introduced to the shower head to increase the nitrogen content and/or reduce the carbon content of the resulting film of $Ti_xAl_{1-x}N$ 50. Both of the reaction precursors are liquids at room temperature, and must be bubbled with helium or otherwise vaporized such as through injection into vaporizers to facilitate transport as gases into the CVD chamber for subsequent deposit on the substrate.

The $Ti_xAl_{1-x}N$ film 50 which is deposited using the chemical vapor deposition technique described, above, forms the lower cell plate of the capacitor being fabricated. Layer 50 is then patterned as shown. The barrier properties of $Ti_xAl_{1-x}N$ film 50 improve as the thickness is increased, but the conductivity decreases with increasing thickness. Still further, the rate of oxidation of $Ti_xAl_{1-x}N$ film 50 decreases as the variable "x" decreases while the conductivity of the same film 50 decreases as well. In order to maintain good electrical contact between the underlying substrate 30 and the node 32, while simultaneously impeding diffusion of silicon through $Ti_xAl_{1-x}N$ film 50, the variable "x" is maintained in a range of about 0.4 to about 0.8, and preferably between 0.5 to about 0.7, with a value of about 0.6 being most preferred.

Figure 4:
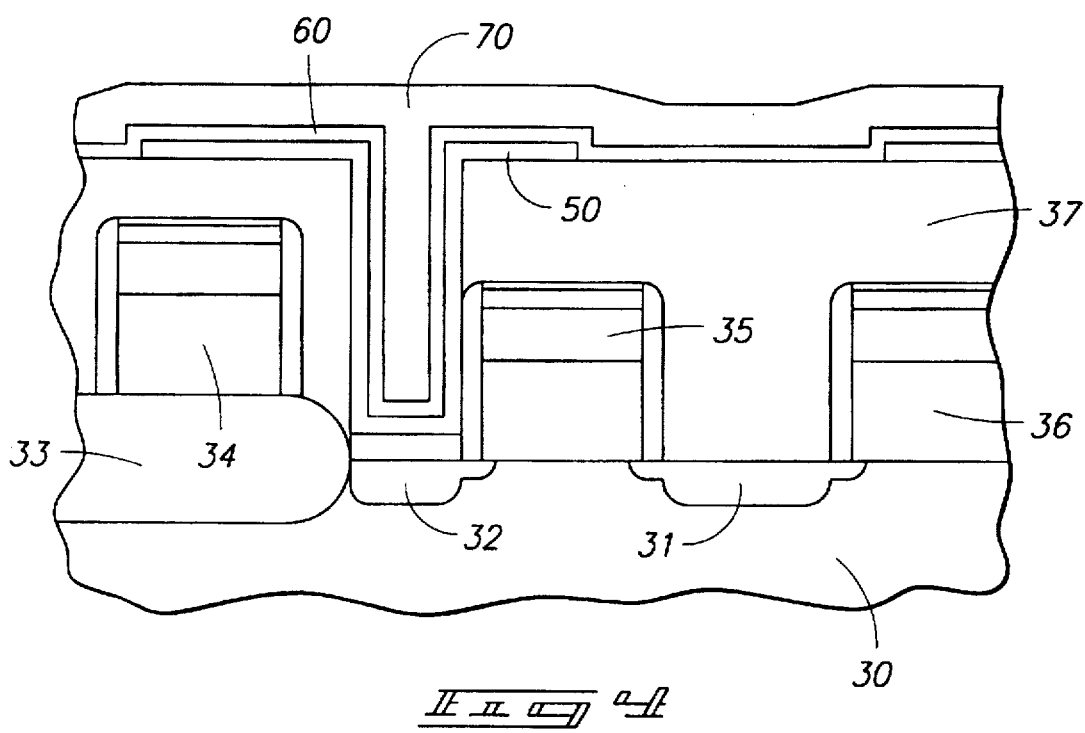
FIG. 4 is a view of the FIG. 2 wafer at a processing step subsequent to that shown by FIG. 3.
Figure 5:
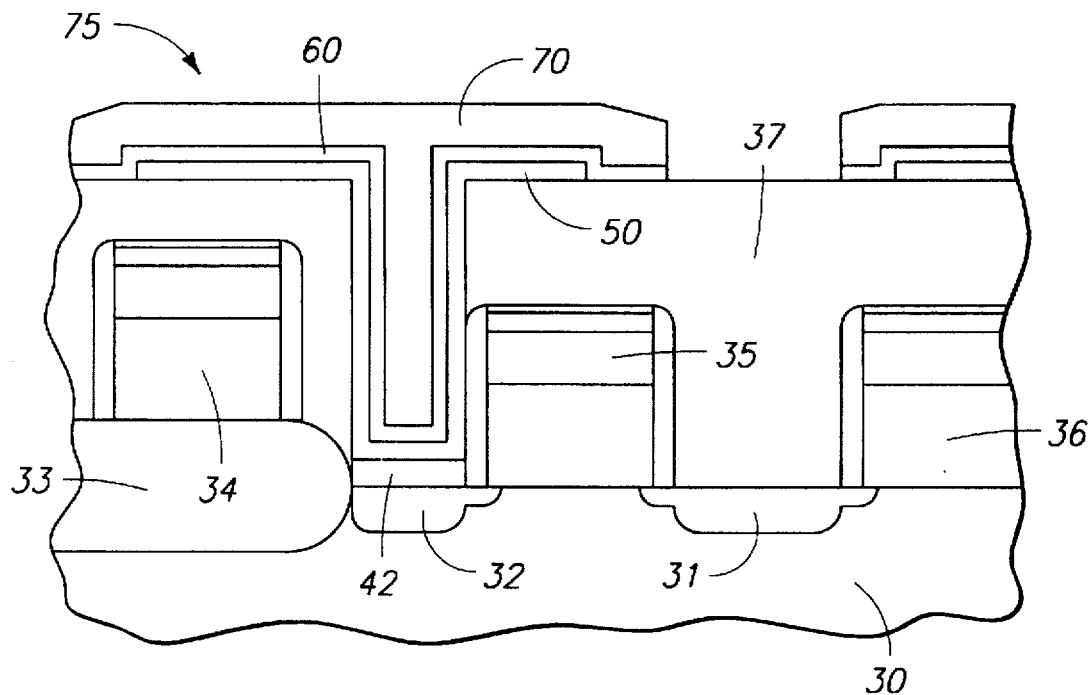
FIG. 5 is a view of the FIG. 2 wafer at a processing step subsequent to that shown by FIG. 4.

As seen in FIG. 4, a dielectric, or ferroelectric layer 60 is deposited by a chemical vapor deposition technique, outwardly of the film of $Ti_xAl_{1-x}N$ 50. The dielectric layer 60 may be annealed in an oxygen or nitrogen ambient, after deposition, to improve the capacitor leakage current by modifying the grain structure to make more desirable grains or further to remove defects at the upper electrode interface. The annealing temperature is ideally kept below 600 degrees C to prevent oxidation of the film of $Ti_xAl_{1-x}N$ 50, which constitutes the lower electrode. An upper electrode 70 is thereafter formed. The upper electrode 70 may constitute a film of $Ti_xAl_{1-x}N$ or some other conductive material The upper electrode is thereafter patterned and etched as shown in FIG. 5. A capacitor 75 is thus formed.

Figure 6:
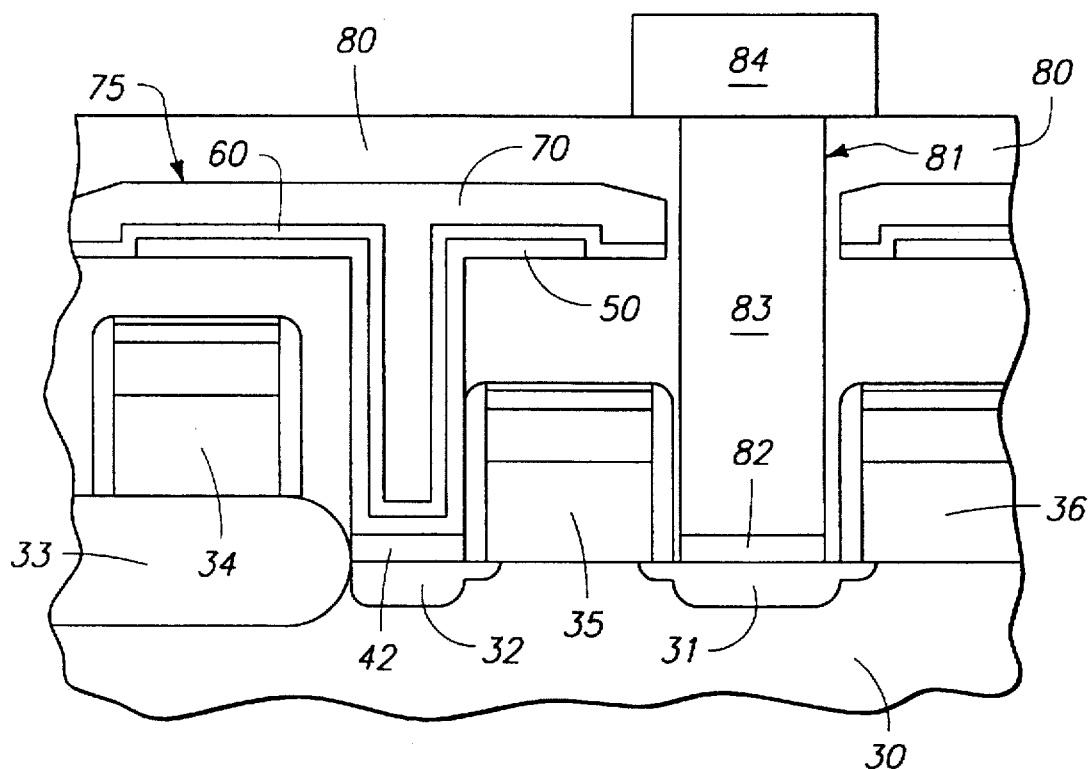
FIG. 6 is a view of the FIG. 2 wafer at a processing step subsequent to that shown in FIG. 5.

As seen in FIG. 6, a layer of planarized silicon dioxide 80 is provided outwardly of the capacitor 75 to isolate same. A contact opening 81 is made through the planarized silicon dioxide 80 to the underlying node 31. A silicide layer 82 is formed in ohmic electrical contact with the underlying node 31. A conductive plug 83 is formed thereafter in the contact opening 81, and a bit line 84 electrically connects with the conductive plug 83.

As seen in FIG. 7, a further embodiment of the invention is shown. A silicon substrate 90 is formed and which has diffusion regions 91, and 92 formed therein. A field oxide region 89 is also provided. Word lines 93 and 94 are formed outwardly of the substrate 90, and a silicon dioxide layer 95 is formed in covering relation to the word lines. A contact opening 96 is formed in the silicon dioxide layer 95 and an electrical connection is made to the underlying diffusion region 91 by means of a conductive plug 97. A capacitor 100 is shown in FIG. 7, and which comprises a lower electrode 101. The lower electrode 101 is formed outwardly of the silicon dioxide layer 95 and is positioned in ohmic electrical contact with the conductive plug 97. A film of $Ti_xAl_{1-x}N$ 102 is formed outwardly of the lower electrode 101 by the method described earlier. Still further, a dielectric or ferroelectric layer 103 is formed outwardly of the layer of $Ti_xAl_{1-x}N$ 102. An upper electrode 104 is thereafter formed atop the dielectric layer or ferroelectric layer 103. A planarized layer of silicon dioxide 105 is formed atop the upper electrode. Thereafter, a contact opening 106 is formed through the silicon dioxide layers 95 and 105 to the diffusion area 92. Electrical contact to the diffusion area 92 is established by means of a conductive plug 107, through a corresponding bit line 108 which is formed outwardly of the silicon dioxide layer 105.

The structure, method of fabrication and operation of the present invention is believed to be readily apparent, but is briefly summarized at this point. One aspect of the present invention relates to a capacitor 75 comprising a pair of conductive electrodes 50, and 70 separated by a dielectric layer 60, and wherein at least one of the electrodes comprises $Ti_xAl_{1-x}N$, and wherein "x" lies in a range of about 0.4 to about 0.8.

Another aspect of the present invention relates to an electrically conductive silicon diffusion barrier material 102 comprising $Ti_xAl_{1-x}N$, and wherein "x" lies in a range of about 0.4 to about 0.8.

Still further, the present invention relates to an integrated circuit comprising:

a capacitor 100 having a pair of conductive electrodes 101, and 104 separated by a dielectric layer 103;

a substrate 90 having a node 91, and one of the capacitor electrodes 101 being in ohmic electrical connection with the node 91; and an intervening layer 102 being positioned intermediate the node 91, and one of the electrodes 104, the intervening layer 102 comprising electrically conductive $Ti_xAl_{1-x}N$, and wherein "x" is in a range of about 0.4 to about 0.8.

Still further, the present invention relates to a method for forming an electrically conductive diffusion barrier on a silicon substrate comprising:

providing a chemical vapor deposition reactor having a chamber;

positioning the silicon substrate in the chemical vapor deposition reactor chamber;

providing a source of gaseous titanium, aluminum and nitrogen to the chemical vapor deposition reactor chamber; and providing temperature and pressure conditions in the chemical vapor deposition reactor chamber effective to deposit an electrically conductive diffusion barrier layer on the silicon substrate comprising $Ti_xAl_{1-x}N$, and wherein "x" is in a range of about 0.4 to about 0.8.

In compliance with the statute, the invention has been described in language more or less specific as to structural and methodical features. It is to be understood, however, that the invention is not limited to the specific features described since the means disclosed herein comprise preferred forms of putting the invention into effect. The invention is, therefore, claimed in any of its forms or modifications within the proper scope of the appended claims appropriately interpreted in accordance with the Doctrine of Equivalents.

I claim:

1. A capacitor, comprising:

a silicon substrate having a node to which electrical connection is to be made;

a layer of silicon dioxide positioned on the silicon substrate and defining a contact opening to the underlying node;

a layer of substantially unoxidized titanium silicide positioned entirely within the contact opening and disposed in conductive electrical connection with the underlying node;

a substantially unoxidized lower cell plate comprising a layer of $Ti_xAl_{1-x}N$, and wherein the "x" lies in a range of about 0.4 to about 0.8, and wherein a portion of the lower cell plate is received in the contact opening and is positioned in conductive electrical connection with the underlying layer of unoxidized titanium silicide, and another portion of the lower cell plate is positioned outside of the contact opening;

a dielectric layer positioned in contact with and covering the entire lower cell plate; and an upper cell plate positioned on the dielectric layer and having a portion which is positioned in the contact opening and another portion which is positioned outside of the contact opening.

2. A capacitor as claimed in claim 1, wherein the unoxidized lower cell plate has a thickness of about 300 to about 1500 Angstroms, and wherein "x" is about 0.6.

3. A capacitor as claimed in claim 1, wherein the unoxidized lower cell plate has a thickness of about 600 Angstroms and "x" is about 0.6.

4. A capacitor, comprising:

a silicon substrate having a node to which electrical connection is to be made;

a layer of silicon dioxide positioned on the silicon substrate and defining a contact opening to the node;

a conductive plug received in the contact opening and positioned in conductive electrical connection with the underlying node;

a substantially unoxidized lower electrode positioned outwardly of the layer of silicon dioxide and disposed in conductive electrical connection with the conductive plug and the node;

a film of $Ti_xAl_{1-x}N$ positioned on the lower electrode, and wherein the "x" lies in a range of about 0.4 to about 0.8;

a dielectric layer positioned in contact with and covering the entire lower electrode; and an upper electrode positioned outwardly of the dielectric layer.

* * * * *

UNITED STATES PATENT AND TRADEMARK OFFICE
CERTIFICATE OF CORRECTION

PATENT NO. : 5,760,474
DATED : June 2, 1998
INVENTOR(S) : Paul J. Schuele

It is certified that error appears in the above-identified patent and that said Letters Patent is hereby corrected as shown below:

Column 4, line 9, delete the word "suicide" and insert the word --silicide--.

Column 4, line 24, delete the phrase "which ha s been heated" and insert the phrase --which has been heated--.

Column 4, line 65, after the word "material", insert --.--.

Signed and Sealed this

Twenty-second Day of September, 1998

Attest:

BRUCE LEHMAN

*Attesting Officer*  *Commissioner of Patents and Trademarks*